(12) United States Patent
Zhao et al.

(10) Patent No.: US 11,135,649 B2
(45) Date of Patent: Oct. 5, 2021

(54) DIRECT METAL PRINTING WITH STEREOLITHOGRAPHY

(71) Applicants: Zhi Zhao, Mesa, AZ (US); Chao Wang, Chandler, AZ (US); Yu Yao, Chandler, AZ (US)

(72) Inventors: Zhi Zhao, Mesa, AZ (US); Chao Wang, Chandler, AZ (US); Yu Yao, Chandler, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 289 days.

(21) Appl. No.: 16/286,006

(22) Filed: Feb. 26, 2019

(65) Prior Publication Data

US 2019/0262897 A1    Aug. 29, 2019

Related U.S. Application Data

(60) Provisional application No. 62/635,907, filed on Feb. 27, 2018.

(51) Int. Cl.
*B22F 3/115*    (2006.01)
*B22F 10/10*    (2021.01)
(Continued)

(52) U.S. Cl.
CPC ............ *B22F 10/10* (2021.01); *B22F 1/0018* (2013.01); *B29C 64/00* (2017.08); *B33Y 10/00* (2014.12);
(Continued)

(58) Field of Classification Search
None
See application file for complete search history.

(56) References Cited

U.S. PATENT DOCUMENTS 10,494,721 B1 *    12/2019    Robinson ............ C23C 18/1641
2010/0105794 A1 *   4/2010    Dietliker .............. C07D 487/04
                                                      522/46
(Continued)

OTHER PUBLICATIONS

Sato-Berru, R. et al., "Silver nanoparticles synthesized by direct photoreduction of metal salts. Application in surface-enhanced Raman Spectroscopy", J. of Raman Spectroscopy, vol. 40, pp. 376-380, published online Oct. 20, 2008.*

(Continued)

*Primary Examiner* — George Wyszomierski
(74) *Attorney, Agent, or Firm* — MH2 Technology Law Group LLP

(57) ABSTRACT

An additive manufacturing process for forming a metallic layer on the surface of the substrate includes fabricating a substrate from a polymerizable composition by a stereolithographic process, and contacting the reactive surface with an aqueous solution including a metal precursor. The metal precursor includes a metal, and the polymerizable composition includes a multiplicity of multifunctional components. Each multifunctional component includes a reactive moiety extending from a surface of the substrate to form a reactive surface. An interface between the reactive surface and the aqueous solution is irradiated to form nanoparticles including the metal. The nanoparticles are chemically coupled to the reactive surface by reactive moieties, thereby forming a metallic layer on the surface of the substrate.

19 Claims, 7 Drawing Sheets

(51) Int. Cl.
  *B33Y 70/00*  (2020.01)
  *B33Y 10/00*  (2015.01)
  *H05K 1/09*  (2006.01)
  *B29C 64/00*  (2017.01)
  *B22F 1/00*  (2006.01)

(52) U.S. Cl.
  CPC .............. *B33Y 70/00* (2014.12); *H05K 1/092* (2013.01); *B22F 2301/255* (2013.01); *B22F 2998/10* (2013.01); *B22F 2999/00* (2013.01)

(56) References Cited

U.S. PATENT DOCUMENTS

2012/0244322 A1* 9/2012 Morhard ............. C23C 18/1603
    428/172
2018/0088462 A1* 3/2018 Vyatskikh ................. G03F 7/40
2020/0223999 A1* 7/2020 Malic ...................... C08L 51/08
2020/0331196 A1* 10/2020 Dvash ................... B29C 64/112

OTHER PUBLICATIONS

U.S. Appl. No. 16/653,389, Zhao et al., filed Oct. 15, 2019.

* cited by examiner

*Initialization:*

$$H_2O \xrightarrow{h\nu} H\bullet + OH\bullet, \qquad H\bullet \xrightarrow{h\nu} H^+ + e^-_{aq}$$

*Radical transfer:*

$$H\bullet + R_2CHOH \to H_2 + R_2\dot{C}OH, \qquad OH\bullet + R_2CHOH \to H_2O + R_2\dot{C}OH$$

*Metal reduction:*

$$M^+ + e^-_{aq} \to M, \quad M^+ + H\bullet \to M + H^+, \quad M^+ + R_2\dot{C}OH \to M + R_2CO + H^+, \quad nM \to (M)_n$$

FIG. 3

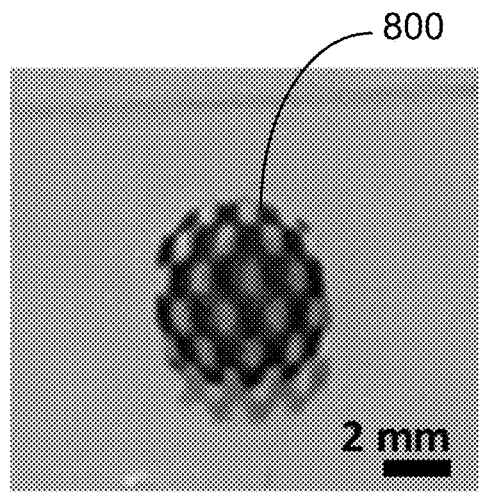
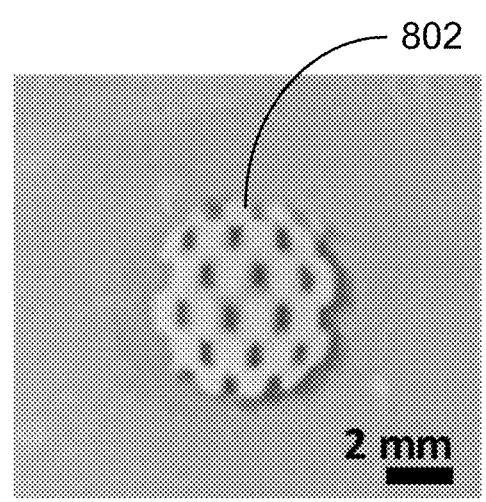
FIG. 8A    FIG. 8B
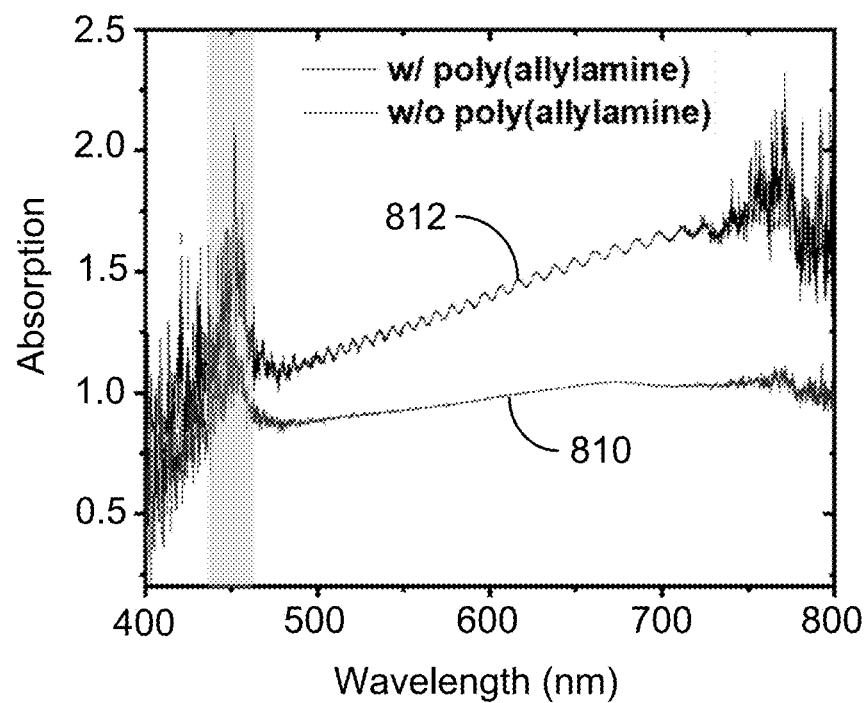
FIG. 8C

DIRECT METAL PRINTING WITH STEREOLITHOGRAPHY

This application claims the benefit of U.S. 62/635,907 entitled "DIRECT METAL PRINTING WITH STEREOLITHOGRAPHY" and filed on Feb. 27, 2018, which is incorporated by reference herein in its entirety.

TECHNICAL FIELD

This invention relates to direct metal printing with stereolithography.

BACKGROUND

Stereolithography, also known as optical fabrication, is a three-dimensional (3D) printing technique developed recently as a form of additive manufacturing technology. In principle, stereolithography applies programmable light projection to build up designed structure in a layer-by-layer fashion. FIG. 1 depicts components of a typical stereolithography printer system 100.

Stereolithography has many advantages compared to other printing methods, including the potential of high printing resolution determined by the diffraction limit of optics, rapid printing speed, suitability for a wide range of materials, and the ability to print objects in a wide range of dimensions without the need for solid supports. Stereolithography has been used to print mainly polymeric materials by photo-polymerization, by which light triggers free radical polymerization to link organic monomers together, forming continuous polymer chains. Resulting 3D objects can be tens of centimeters in overall size, printed at resolutions as high as 10 µm.

Despite advantages associated with stereolithography, there are still some limitations of stereolithography in its current form. For example, most stereolithography processes are limited to the formation of soft materials such as polymers and hydrogels.

Current metal printing mainly relies on thermal/laser assisted metal fusion or ink-jet printing of metal powders. The metal fusion process typically requires extreme conditions, which is generally incompatible with organic materials. The ink-jet printed metal powders typically undergo a post-fabrication annealing process before they can form continuous structures. This process usually employs high power laser or high temperature, which may also damage organic materials. Thus, printing metals as well as other types of materials (e.g., organic polymers) with a single platform has been difficult to achieve. In addition, current metal printing techniques have limited resolution, and therefore may not be suitable for electronic device applications.

SUMMARY

As described herein, continuous metallic structures of various shapes can be directly printed with stereolithography printers under ambient conditions from aqueous printing media. The aqueous printing media allows fabrication of continuous metal structures using photochemical processes, and the metal structures can be chemically bound to non-metallic materials, such as polymers and hydrogels. The printed metal structures have electrical conductivity that is comparable to that of bulk metals. The resolution of the resulting metal patterns can be up to 2.5 which readily allows for the deposition of electronic circuits at the surface of 3D objects. The metal printing process occurs at ambient conditions, and post-fabrication treatments are not needed to yield the final product. No template or mold is involved in the fabrication process. The metal patterns can be bound to soft materials, such as polymers and hydrogels, through chemical interactions during fabrication. As such, metal-organic hybrid materials can be fabricated using a single stereolithography platform.

In a general aspect, additive manufacturing includes fabricating a substrate from a polymerizable composition by a stereolithographic process, and contacting the reactive surface with an aqueous solution including a metal precursor. The metal precursor includes a metal, and the polymerizable composition includes a multiplicity of multifunctional components. Each multifunctional component includes a reactive moiety extending from a surface of the substrate to form a reactive surface. An interface between the reactive surface and the aqueous solution is irradiated to form nanoparticles including the metal. The nanoparticles are chemically coupled to the reactive surface by reactive moieties, thereby forming a metallic layer on the surface of the substrate.

Implementations of the general aspect may include one or more of the following features.

The substrate is typically an organic polymer or a hydrogel. The multifunctional component includes allylamine, and the reactive moiety includes amine. The polymerizable composition may include an acrylate monomer (e.g., a diacrylate monomer, such as 1,6-hexanediol diacrylate). In some cases, the polymerizable composition includes a photoinitiator (e.g., phenylbis(2,4,6-trimethylbenzoyl) phosphine oxide). The metal is typically a transition metal (e.g., silver, gold, palladium, copper, or the like). In some cases, the aqueous solution includes a chelating agent (e.g., citrate).

Some implementations include forming an additional metallic layer on the surface. In some cases, a conductance of the metallic layer is the same order of magnitude as a conductance of the metal in bulk form. In certain cases, the metallic layer forms a continuous film on the substrate. The continuous film may include a multiplicity of nanoparticles, nanoparticle aggregates, or both. In some cases, a dimension of the continuous film exceeds a dimension of the nanoparticles by at least a factor of 1000.

The metallic layer is typically formed under ambient conditions. In one example, a dimension of the metallic layer is at least 1 cm. A resolution of the metallic layer can be up to 10 µm.

Applications of the stereolithography printing methods described herein include formation of prototype electronic devices and deposition of electronic circuits onto vulnerable materials, including hydrogels and biological samples. Resulting devices are suitable for soft robotics, biochemical sensors, responsive coatings, solar harvesting devices, intelligent electromagnetic devices (e.g., antennas, photo-modulators), smart biomedical devices, and energy storage and conversion devices. The high resolution allows precise deposition of conductive materials, which can be used to fabricate semiconductor devices that contain many small domains of two-dimensional (2D) materials (e.g., $MoS_2$).

BRIEF DESCRIPTION OF THE DRAWINGS

FIG. 3 depicts a reaction pathway for formation of metal nanoparticles from metal ions in an aqueous solution by photolysis.

FIG. 8A is an image of a checkboard pattern formed by stereolithography without using poly(allylamine). FIG. 8B is an image of a checkboard pattern formed by stereolithography with the addition of poly(allylamine). FIG. 8C shows the transmission spectra of the metal patterns in FIGS. 8A and 8B.

DETAILED DESCRIPTION

Figure 1:
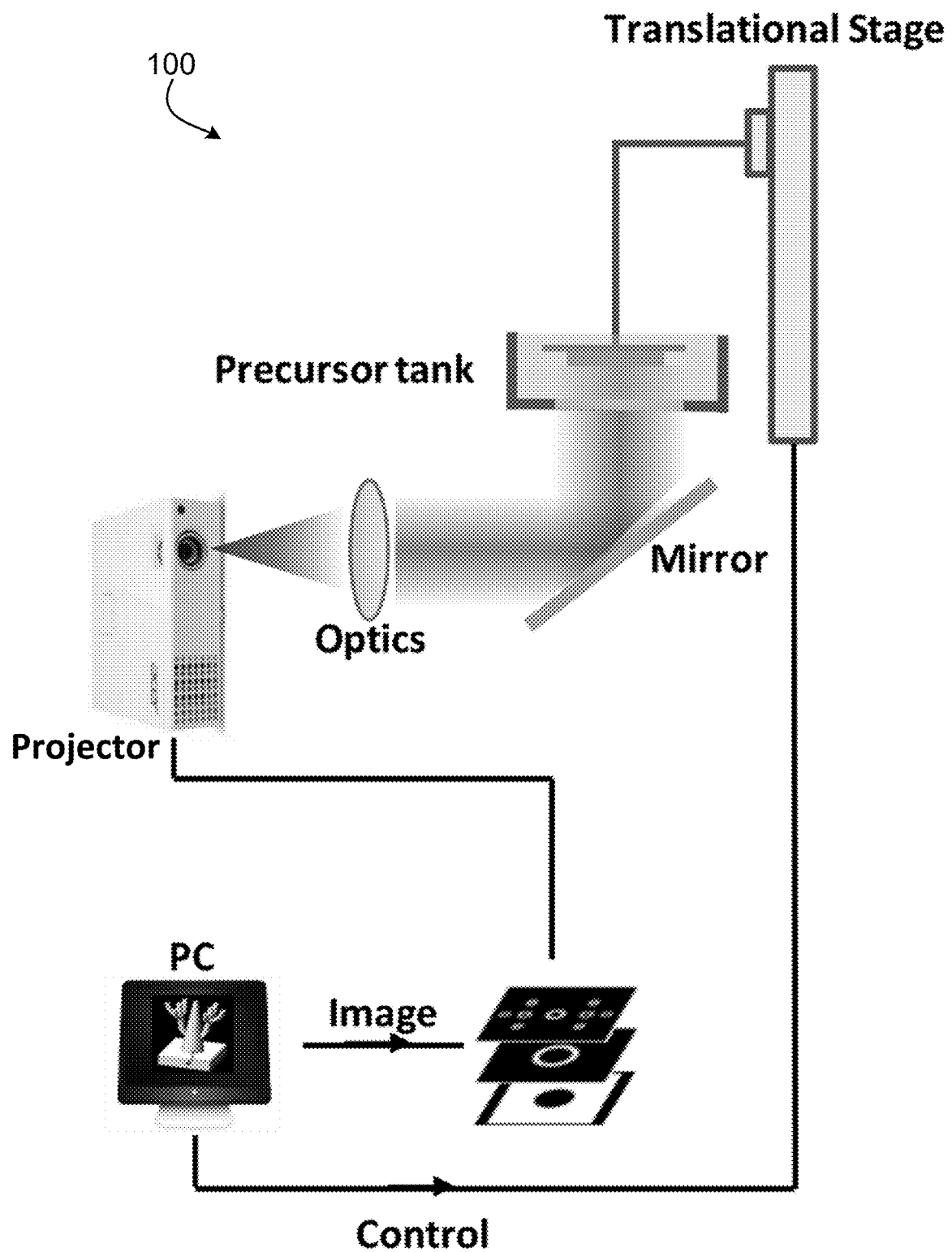
FIG. 1 depicts a stereolithography based printer system.
Figure 2:
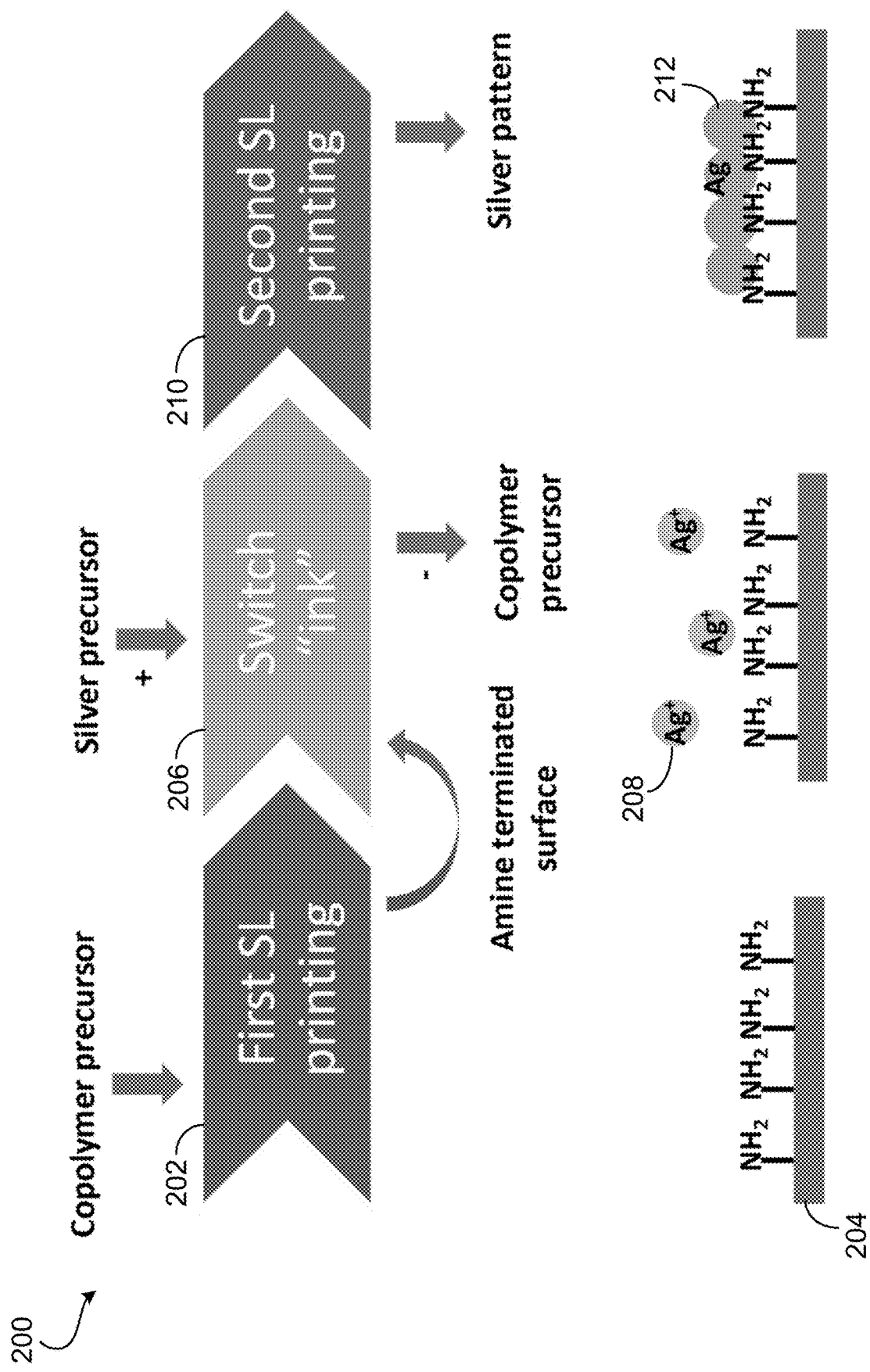
FIG. 2 depicts a process flow for direct metal printing by stereolithography.

Methods and materials for direct stereolithographic printing of metal structures by ligand-assisted optical metal deposition are described. The process includes metal nanoparticle (MNP) generation and growth or interconnection of the MNPs. FIG. 2 depicts a process flow 200 for direct stereolithographic printing of metal structures by ligand-assisted optical metal deposition.

As depicted in FIG. 2, a first stereolithography printing step 202 with a copolymer precursor yields a surface selected to bind MNPs by complexation. In one example, a copolymer precursor is selected to yield a substrate with an amine-terminated surface 204. In 206, the substrate is immersed in an aqueous solution containing a metal precursor and ions selected to interact with the metal precursor to form metal nanoparticles. The metal precursor is typically in the form of metal ions 208. Although FIG. 2 depicts silver ions, suitable metal precursors include transition metal ions such as palladium ions, copper ions, and gold ions. In the second stereolithography printing step 210, MNPs 212 are generated by photolysis of metal complexes, yielding metal particles. In the photolysis of metal complexes, irradiation with ultraviolet (UV) or visible radiation generates several types of reducing agents, which reduce metal ions into elemental metal. A representative reaction pathway is shown in FIG. 3. As depicted in FIG. 3, UV or visible irradiation of an aqueous solution yields hydrated electrons, hydroxyl radicals, and hydrogen atoms. In the presence of a secondary alcohol, the hydroxyl and hydrogen radicals can be rapidly consumed to form organic radicals. The hydrated electrons, hydrogen atoms, and organic radicals are all good reducing agents that enable the formation of MNPs from metal ions in solution. The MNPs may form clusters of MNPs from metal ions. As depicted in FIG. 2, the MNPs 212 interact with the surface of the substrate prepared in the first stereolithography printing step, forming a continuous metal layer on the surface of the substrate. A desired pattern of the metal layer can be printed by selective illumination of the treated surface in the first stereolithography printing step 202.

Figure 4:
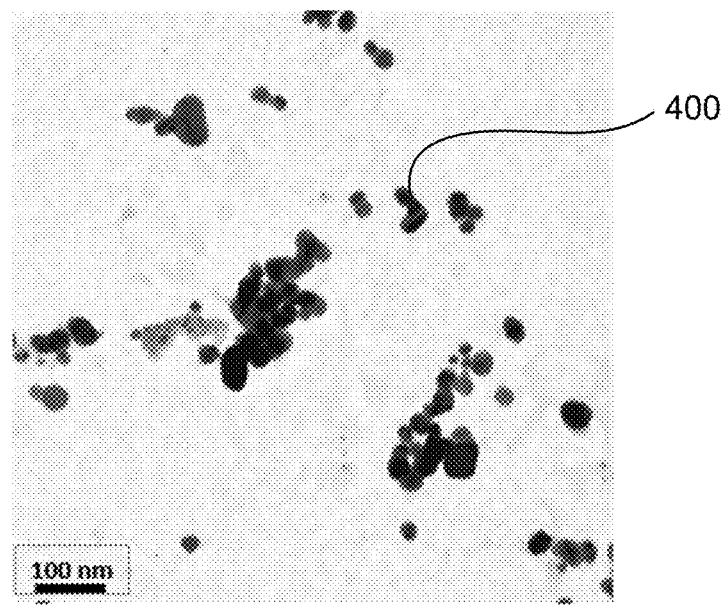
FIG. 4 shows an image of metal nanoparticles formed in aqueous photolysis.

In one example, silver nanoparticles were formed by irradiating a solution formed by dissolving silver nitrate and sodium citrate. The solution was prepared by dissolving 204 mg silver nitrate and 134 mg sodium citrate dihydrate into 200 mL deionized (DI) water. This composition was selected to maintain a high Ag(I) concentration, maintain an excess of citrate ion, and avoid Ag(I) precipitation, and resulted in the rapid generation of a large amount silver nanoparticles. Formation of the silver nanoparticles occurs by photolysis of the silver complexes, in which several types of reducing agents are generated by irradiation of the solution with light, as depicted generally in FIG. 2. The photolysis reaction can be initiated by visible and UV radiation. UV radiation can quickly trigger the photoreaction, changing the color of the silver solution from clear to dark brown within 2 min. In contrast, visible radiation led to a slower reaction rate, generating a light yellow solution within 20 min. This aqueous photolysis reaction generates MNPs, such as MNPs 400 shown in FIG. 4, rather than continuous metal structures. Extending a duration of the irradiation did not appear to result in larger MNPs or larger MNP aggregates. This behavior is attributed to the presence of excess citrate that forms a charged protective layer on the silver nanoparticles, inhibiting further aggregation of the nanoparticles by coulombic repulsion.

Allylamine (AAm) and polyallylamine (pAAm) are ligands and reducing agents for silver ions. The amine groups in AAm and pAAm form coordination complexes with Ag(I) ions. When added into the Ag(I)-citrate solution, they can partially replace the citrate capping layer on Ag nanoparticles. Since AAm and pAAm are electrically neutral, this leads to a lower surface charge density that can potentially increase MNP aggregation. This reaction pathway, however, is not photosensitive, meaning that it cannot be triggered by photo-illumination in the stereolithography. In addition, the mixture of Ag(I) ion and amines is not very stable owing to the alkalinity of the amine group. As such, AgOH may be formed.

Figures 5A, 5B, 5C, 5D:
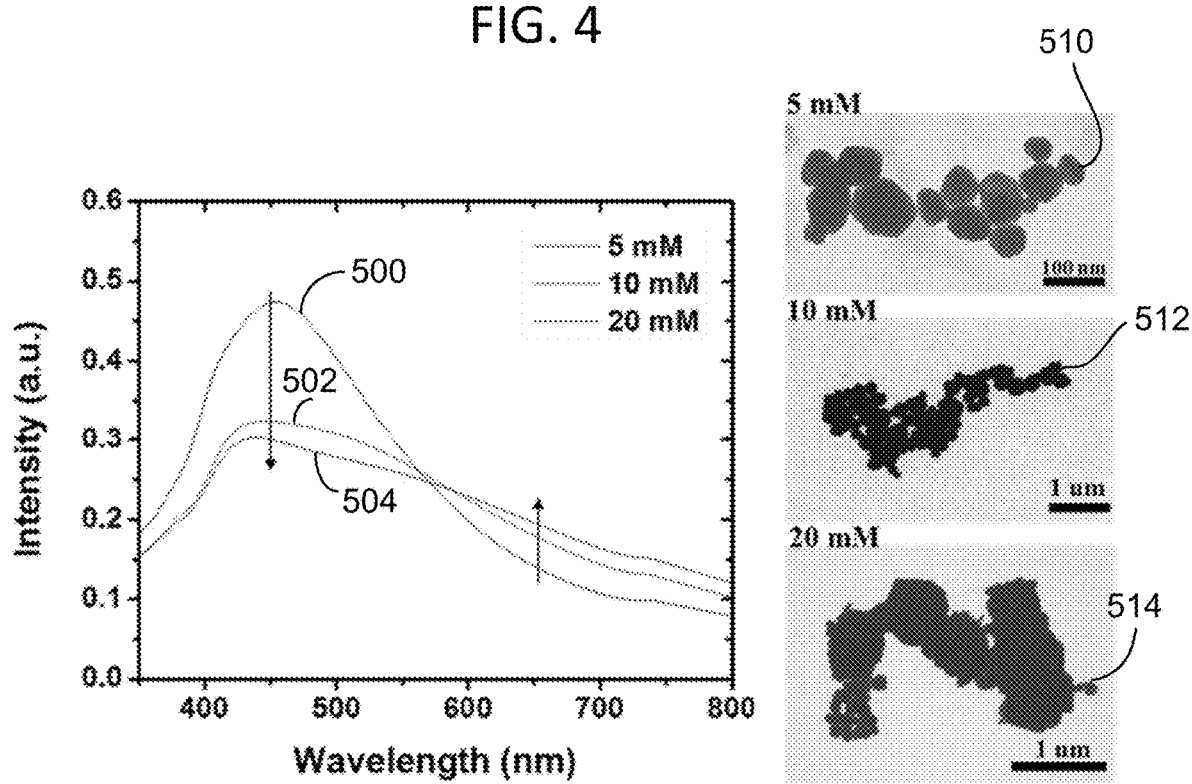
FIG. 5A shows the optical absorption of silver particles formed by photolysis under the presence of different concentrations of polyallylamine.
FIGS. 5B-5D show images of metal nanoparticle aggregates formed with the different concentrations of polyallylamine.

Silver citrate photochemistry and the complexation between silver ions and pAAm was demonstrated by adding pAAm to a silver citrate solution formed as described previously. After irradiation, the solution turned yellow in approximately 3 min, and reflective coatings of metallic features were formed at the bottom surface of the microcentrifuge tube. Transmission electron microscopy (TEM) and spectral measurements revealed that when pAAm was added, individual silver nanoparticles started to aggregate into continuous structures. This aggregation was dependent on the initial concentration of amine groups in pAAm. FIG. 5A shows plots of intensity versus wavelength of 5 mM solutions 500, 10 mM solutions 502, and 20 mM solutions 504. As shown in FIG. 5A, aggregation at 20 mM exceeded that at 5 mM and 10 mM. Images of the corresponding silver nanoparticles 510, 512, 514 are shown in FIGS. 5B-5D, respectively.

Figure 6:
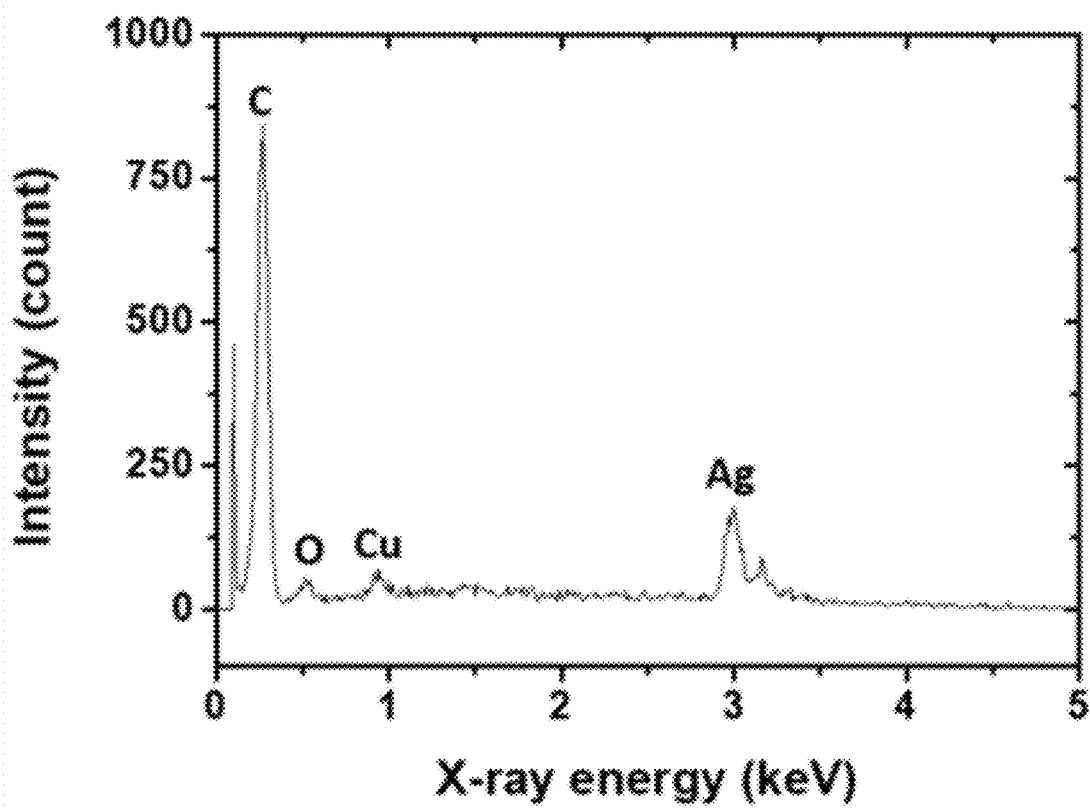
FIG. 6 shows a composition of metal nanoparticle aggregates as assessed by energy dispersive X-ray spectroscopy (EDX).
Figure 7:
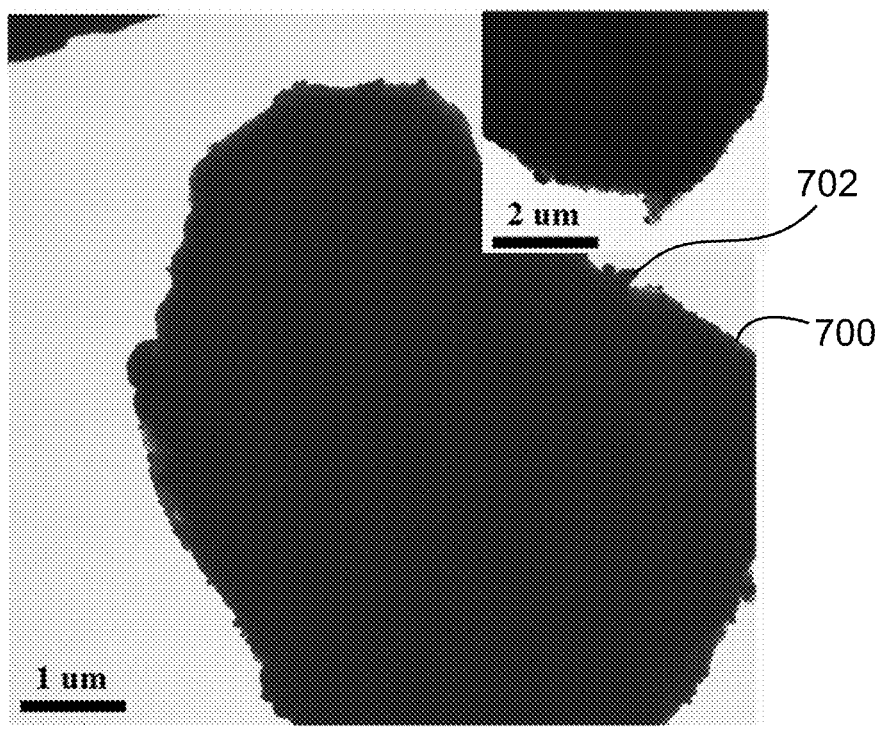
FIG. 7 is a transmission electron microscope image of a metal flake formed by stereolithography.

The formation of silver nanoparticle (AgNP) aggregates is believed to involve the following mechanism. First, individual AgNPs are formed through the photoreduction of Ag(I) by citrate. Next, AgNPs bind to pAAm by complexation and are forced to stay close to each other. Finally, further Ag(I) reduction happens due to continuous light irradiation. The composition of aggregates found in TEM has been examined by energy dispersive X-ray spectroscopy (EDX), as shown in FIG. 6. The AgNP aggregates are essentially pure silver, with very little oxidation, if any, as the atomic abundance of O is only 7% of Ag. Note the O may come from the substrate that the AgNPs are deposited on. The C and Cu peaks in FIG. 6 are derived from the substrate, which was copper mesh covered with polycarbon film. It is believed that, at the reactor surface, pAAm aligns with the hydrophobic backbone along the substrate and the amine groups facing the solution. Such an alignment facilitates the formation of continuous AgNP film. This understanding is confirmed by TEM of that was formed. FIG. 7 shows TEM images of samples scratched from a metallic-looking layer formed as described in this example. The samples appears to be large flakes 700, with nanoparticles 702 attached to the edges, suggesting that the flakes are grown from individual nanoparticles.

Taking advantage of the AgNP aggregation and Ag layer formation described previously, a substrate was fabricated with stereolithography. A photocurable precursor containing allylamine was used. The precursor was prepared by mixing 95 v/v % 1,6-hexanediol diacrylate (HDDA), 5 v/v % allylamine, and 0.1 wt % phenylbis(2,4,6-trimethylbenzoyl) phosphine oxide. This reaction mixture was cured in 1 min to yield a stiff, transparent layer using stereolithography. Note allylamine was converted to poly(allylamine) during this step. The surface of the cured layer was abundant in —$NH_2$ groups, which served as the ligand to capture Ag(0) and Ag(I). After the substrate was fabricated, a "silver ink" containing silver nitrate and sodium citrate was added to the printing reservoir. When no amine groups were involved, only a dark metal pattern 800 formed on the surface as shown in FIG. 8A, indicating the discontinuity of the metal film. By irradiating the amine containing ink with white light for 10 min, a silver colored pattern 802 was formed on the surface, as shown in FIG. 8B. FIG. 8C shows spectra 810 and 812, which correspond to the samples in FIGS. 8A and 8B, respectively. Comparison of spectra 810 and 812 reveals that the absorption of the metal pattern increases after introduction of allylamine. The fringes in spectrum 812 indicate the presence of thin film interference, which further confirms the continuity of the metal pattern in the sample of FIG. 8B. Thus, the surface —$NH_2$ groups are understood promote interconnection of AgNPs.

Figure 9A:
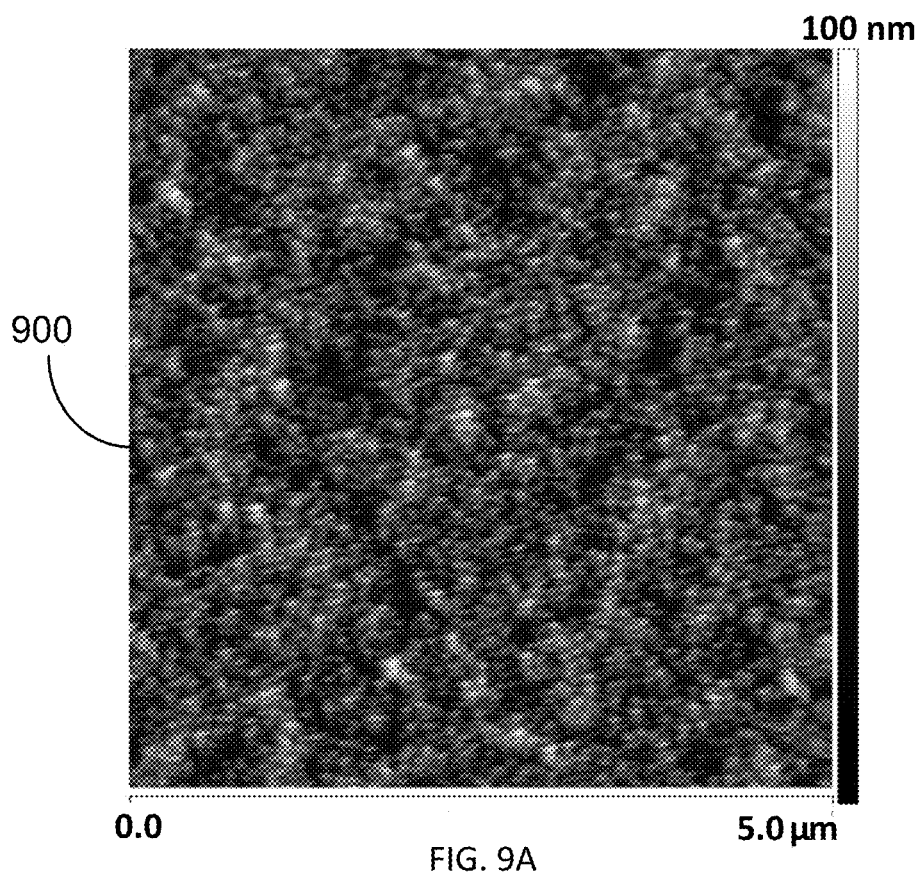
FIG. 9A shows an image of metal nanoparticles deposited by stereolithography on a surface that was not treated to promote linking of the metal nanoparticles.
Figure 9B:
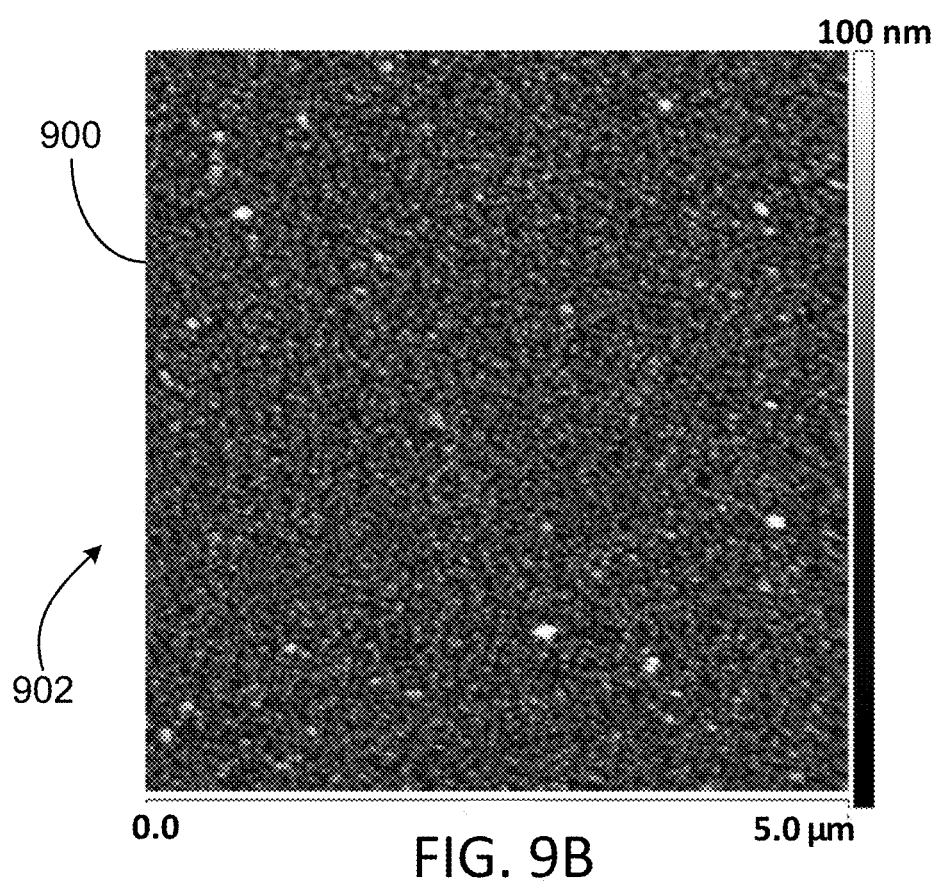
FIG. 9B shows an image of a metal layer deposited by stereolithography on a surface that was treated to promote linking of the metal nanoparticles.

FIG. 9A is an image of AgNPs 900 deposited on a substrate formed without poly(allylamine), and thus lacking surface —$NH_2$ groups. As seen in FIG. 9A, the AgNPs 900 are not linked to form a continuous layer. In contrast, FIG. 9B is an image of AgNPs 900 deposited on a substrate formed with poly(allylamine) that includes surface —$NH_2$ groups. As seen in FIG. 9B, the AgNPs 900 are linked to form a continuous layer or film 902. Note the surface roughness (RMS) was reduced by ⅔ from 7.84±0.83 nm in FIG. 9A to 2.89±0.56 nm in FIG. 9B.

Given the dynamic projection ability of stereolithography, it is possible to quickly switch light distributions and create a variety of silver patterns by forming selected areas with surface —$NH_2$ groups. By adding proper objectives, ultra-fine metal patterns can be created, for example, to achieve a resolution of 10 μm. The continuity of the as-prepared silver patterns was also examined by conductivity testing. The measured conductance of a silver strip was 1.1E7 S/m, which is on the same order as the conductance of bulk silver (6.3E7 S/m).

A number of embodiments have been described. Nevertheless, it will be understood that various modifications may be made without departing from the spirit and scope of disclosure. Accordingly, other embodiments are within the scope of the following claims.

What is claimed is:

1. A method of additive manufacturing, the method comprising:
fabricating a substrate from a polymerizable composition by a stereolithographic process, wherein the polymerizable composition comprises a multiplicity of multifunctional components, each multifunctional component comprising a reactive moiety, and each reactive moiety extends from a surface of the substrate to form a reactive surface; wherein
the multifunctional component comprises allylamine; and
the reactive moiety comprises amine;
contacting the reactive surface with an aqueous solution comprising a metal precursor, wherein the metal precursor comprises a metal;
irradiating an interface between the reactive surface and the aqueous solution to form nanoparticles comprising the metal; and
chemically coupling the nanoparticles to the reactive surface by the reactive moieties, thereby forming a metallic layer comprising the metal on the surface of the substrate.

2. The method of claim 1, wherein the polymerizable composition comprises an acrylate monomer.

3. The method of claim 2, wherein the acrylate monomer comprises a diacrylate monomer.

4. The method of claim 3, wherein the diacrylate monomer comprises 1,6-hexanediol diacrylate.

5. The method of claim 1, wherein the polymerizable composition comprises a photoinitiator.

6. The method of claim 5, wherein the photoinitiator comprises phenylbis(2,4,6-trimethylbenzoyl) phosphine oxide.

7. The method of claim 1, wherein the metal is a transition metal.

8. The method of claim 7, wherein the metal is silver.

9. The method of claim 1, wherein the aqueous solution further comprises a chelating agent.

10. The method of claim 9, wherein the chelating agent comprises citrate.

11. The method of claim 1, further comprising forming an additional metallic layer on the surface.

12. The method of claim 1, wherein a conductance of the metallic layer is the same order of magnitude as a conductance of the metal in bulk form.

13. The method of claim 1, wherein the metallic layer forms a continuous film on the substrate.

14. The method of claim 13, wherein the continuous film comprises a multiplicity of nanoparticles, nanoparticle aggregates, or both.

15. The method of claim 14, wherein a dimension of the continuous film exceeds a dimension of the nanoparticles by at least a factor of 1000.

16. The method of claim 14, wherein a dimension of the metallic layer is at least 1 cm.

17. The method of claim 1, wherein a resolution of the metallic layer is up to 10 μm.

18. The method of claim 1, wherein the metallic layer is formed under ambient conditions.

19. The method of claim 1, wherein the substrate is an organic polymer or a hydrogel.

* * * * *